US005644837A

United States Patent [19]
Fathi et al.

[11] Patent Number: 5,644,837
[45] Date of Patent: Jul. 8, 1997

[54] PROCESS FOR ASSEMBLING ELECTRONICS USING MICROWAVE IRRADIATION

[75] Inventors: Zakaryae Fathi, Cary; Richard S. Garard, Chapel Hill; Jianghua Wei, Raleigh, all of N.C.

[73] Assignee: Lambda Technologies, Inc., Raleigh, N.C.

[21] Appl. No.: 497,019

[22] Filed: Jun. 30, 1995

[51] Int. Cl.$^6$ .................................................. H05K 3/30
[52] U.S. Cl. ........................... 29/832; 29/840; 156/275.7
[58] Field of Search ........................... 29/840, 841, 832, 29/836; 156/273.3, 273.5, 275.5, 275.7

[56] References Cited

U.S. PATENT DOCUMENTS

| 3,471,352 | 10/1969 | Brooke et al. | 156/272 |
|---|---|---|---|
| 3,611,135 | 10/1971 | Margerum | 324/85 |
| 3,619,252 | 11/1971 | Roscher | 117/66 |
| 4,144,468 | 3/1979 | Mourier | 310/72 |
| 4,196,332 | 4/1980 | MacKay B et al. | 219/10.55 |
| 4,340,796 | 7/1982 | Yamaguchi et al. | 219/10.55 |
| 4,381,602 | 5/1983 | McIver | 29/832 |
| 4,415,789 | 11/1983 | Nobue et al. | 219/10.55 |
| 4,434,342 | 2/1984 | Schubring | 219/10.55 |
| 4,504,718 | 3/1985 | Okatsuka et al. | 219/10.55 |

(List continued on next page.)

FOREIGN PATENT DOCUMENTS

| 1000358A7 | 11/1988 | Belgium . |
|---|---|---|
| 0073250 | 2/1982 | European Pat. Off. . |
| 0250159B1 | 6/1987 | European Pat. Off. . |
| 2555188 | 11/1983 | France . |
| 3737148A1 | 5/1988 | Germany . |
| 63006763 | 1/1988 | Japan . |

OTHER PUBLICATIONS

Johnson, et al.; *Use of Variable Frequency Microwave Furnace For Large–Area, Uniform Processing; The American Ceramic Society*; pp. 563–570; (Apr. 1993).

Rudder et al.; *Diamond Chemical Vapor Deposition (CVD) Via Microwave–Excited Plasma From Water–Ethanol Solutions; The American Ceramic Society*; pp. 377–384 (Apr. 1993).

Lauf et al.; *Materials Processing Using A Variable Frequency Microwave Furnace; The American Ceramic Society*; pp. 571–579 (Apr. 1993).

Lauf et al.; *Polymer Curing in a Variable Frequency Microwave Oven; U.S. Department of Energy*; pp. 150–155; (Jul. 1993).

Lauf et al.; *2 to 18 GHz Broadband Microwave Heating Systems; Microwave Journal*; (Nov. 1993).

Johnson et al.; *Effect of Bandwidth on Uniformity of Energy Distribution In a Multi–Mode Cavity*; (Apr. 1994).

Everleigh et al.; *Use of High–Power Traveling Wave Tubes As A Microwave Heating Source*; (Apr. 1994).

Demeuse et al.; *Variable Frequency Microwave Processing of Thermoset Polymer Matrix Composites*; (Apr. 1994).

Johnson et al.; *Use of Variable Frequency Microwave Energy As a Flexible Plasma Tool*; (Apr. 1994).

DeMeuse et al.; *Microwave Processing Of Isocyanate/Epoxy Composites; Proceedings of 1994 Samp Conference*; (May 1994).

(List continued on next page.)

*Primary Examiner*—P. W. Echols
*Assistant Examiner*—Adrian L. Coley
*Attorney, Agent, or Firm*—Bell, Seltzer, Park & Gibson

[57] ABSTRACT

The present invention provides a process for assembling electronics which allows for rapid heating and fast curing, and avoids subjecting the components to potentially damaging cure conditions. The process includes applying conductive or non-conductive curable thermoplastic or thermosetting resins, having adhesive properties, to a surface of the substrate or electrical component or both. One or more electrical components may be mounted on the substrate using the adhesive properties of the resin. The resin is then subjected to variable frequency microwave irradiation selected to cure the resin without adversely affecting the substrate or electrical components.

28 Claims, 3 Drawing Sheets

5,644,837
Page 2

U.S. PATENT DOCUMENTS

| | | | |
|---|---|---|---|
| 4,554,347 | 11/1985 | Hawkes, Jr. | 528/503 |
| 4,568,262 | 2/1986 | Feurer | 425/174 |
| 4,593,167 | 6/1986 | Nilssen | 219/10.55 |
| 4,825,028 | 4/1989 | Smith | 219/10.55 |
| 4,843,202 | 6/1989 | Smith et al. | 219/10.55 |
| 4,855,553 | 8/1989 | Minobe | 219/10.55 |
| 4,866,344 | 9/1989 | Ross et al. | 315/3.5 |
| 4,880,486 | 11/1989 | Maeda | 156/275.7 |
| 4,939,331 | 7/1990 | Berggren et al. | 219/10.55 |
| 5,166,230 | 11/1992 | Stecker | 523/500 |
| 5,222,543 | 6/1993 | Carlstrom et al. | 164/114 |
| 5,232,748 | 8/1993 | Horowitz et al. | 427/553 |
| 5,241,040 | 8/1993 | Cuomo et al. | 528/353 |
| 5,272,216 | 12/1993 | Clark, Jr. et al. | 525/362 |
| 5,296,074 | 3/1994 | Graham et al. | 29/832 |
| 5,296,271 | 3/1994 | Swirbel et al. | 427/493 |
| 5,317,045 | 5/1994 | Clark, Jr. et al. | 523/300 |
| 5,317,081 | 5/1994 | Gelorme et al. | 528/353 |
| 5,321,222 | 6/1994 | Bible et al. | 219/745 |
| 5,324,345 | 6/1994 | Rutjes et al. | 65/64 |
| 5,342,659 | 8/1994 | Horowitz et al. | 427/553 |
| 5,366,573 | 11/1994 | Bayer et al. | 156/273.3 |
| 5,378,298 | 1/1995 | Williams et al. | 156/275.7 |

OTHER PUBLICATIONS

Espinosa et al; *Use of Variable Frequency Microwave Power To Achieve Uniform Results Throughout Large Volumes For Material Processing*; (Jul. 1993).

Bible et al.; *Multikilowatt Variable Frequency Microwave Furnace*; Mat. Res. Soc. Symp. Proc., vol. 269 (Apr. 1992).

International Search Report for PCT/US96/11043.

International Search Report for PCT/US 96/11040.

J.G. Ameen et al.; *Microwave Heating of Electronic Components* IBM Technical Disclosure Bulletin 22, No. 9:3393 (1980).

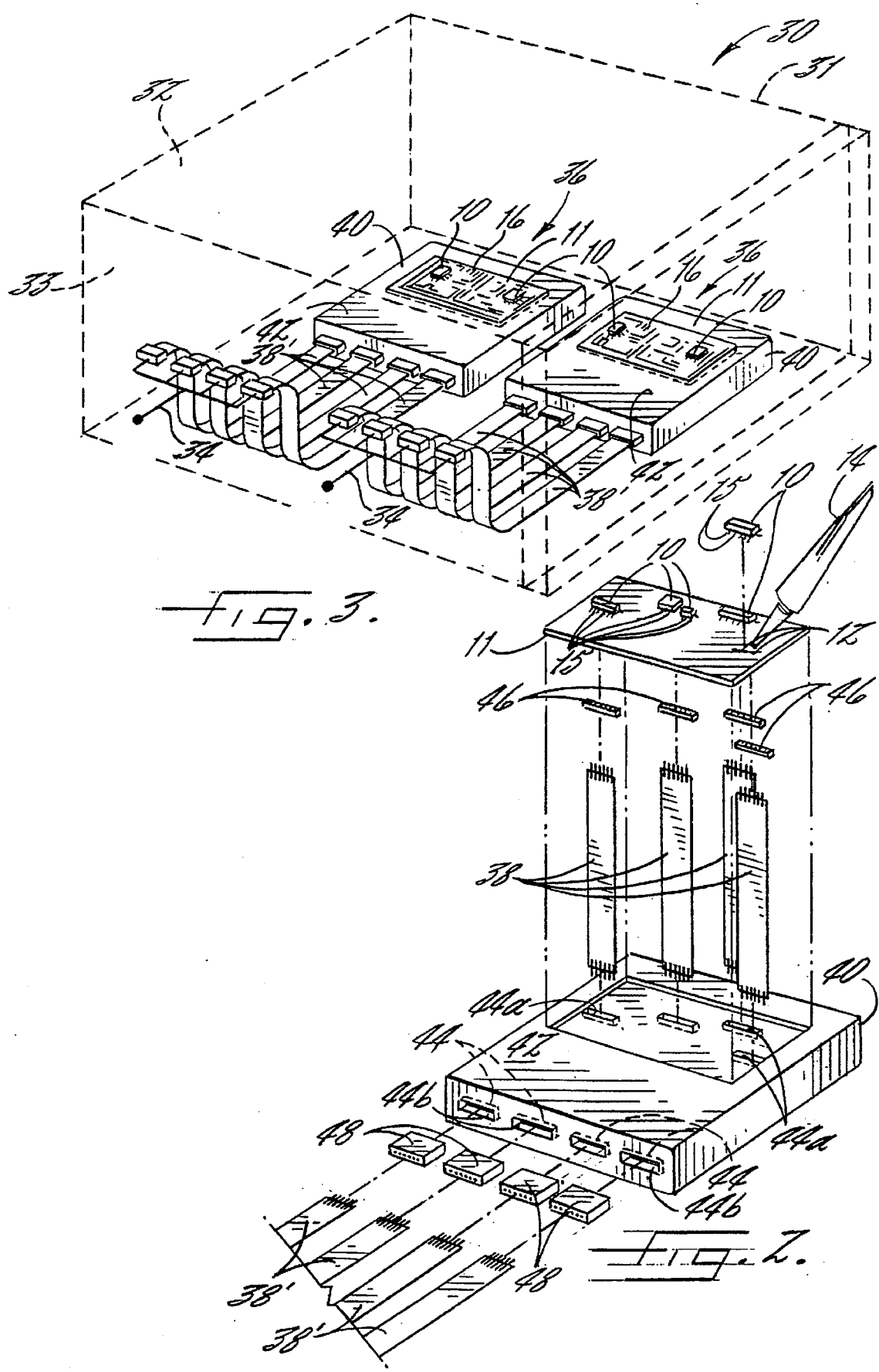

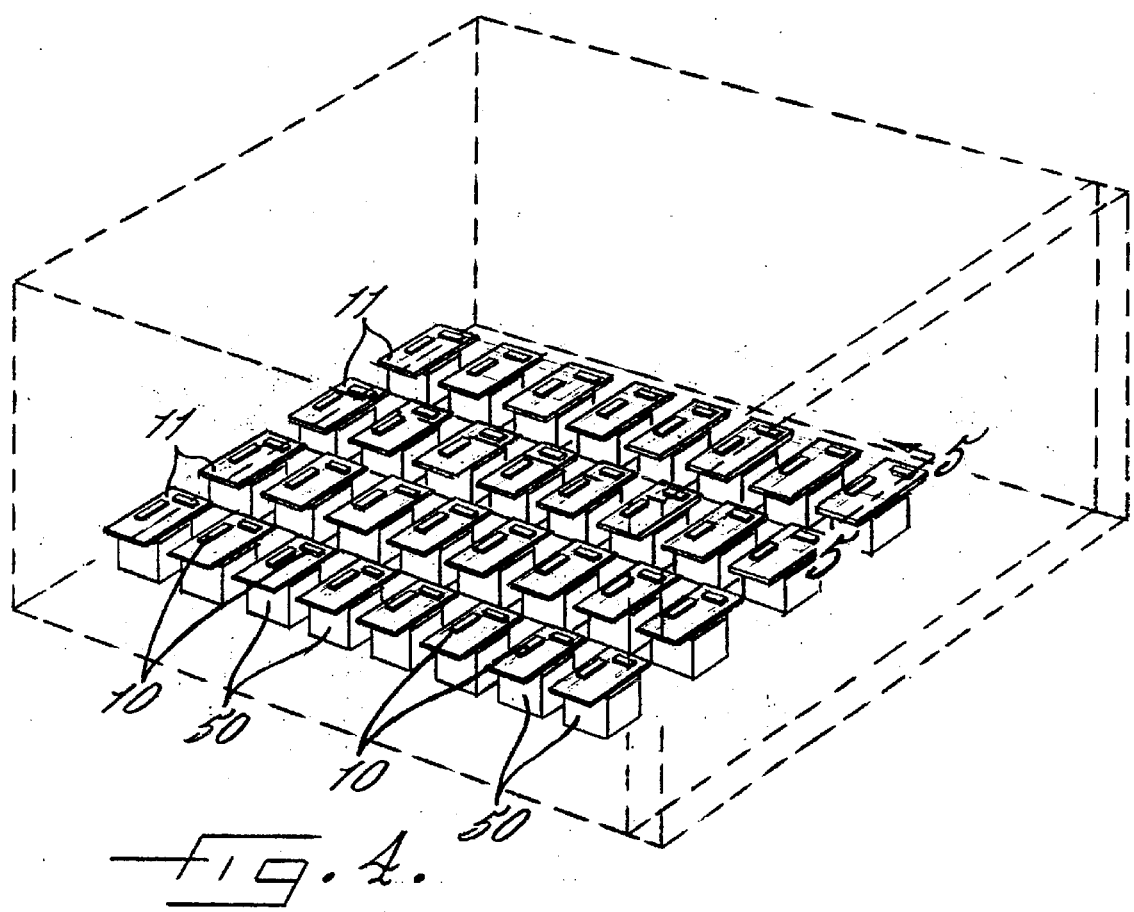
_fig. 4._
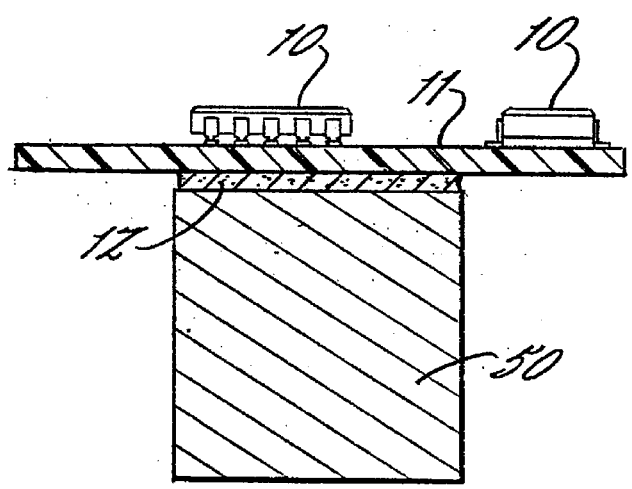
_fig. 5._

PROCESS FOR ASSEMBLING ELECTRONICS USING MICROWAVE IRRADIATION

FIELD OF THE INVENTION

The present invention relates to a process for assembling electronics, and more particularly to a process for assembling electronics facilitated by the use of microwave irradiation.

BACKGROUND OF THE INVENTION

Assembling electronics often comprises mounting various electronic components (e.g., transistors, capacitors, resistors, semi-conductor components, etc.) on an electronic substrate (e.g., a rigid or flexible circuit board). Often, these substrates are, in turn, mounted on or connected to other components and devices. For various reasons, traditional mounting methods utilizing lead-based solder have become less desirable. Increasingly common now are the use of conductive polymeric adhesives to mount electronic components onto electronic substrates, and non-conductive polymeric adhesives to connect various components and devices.

In general, an uncured conductive adhesive is applied to an electronic substrate so that, when placed within the adhesive, the electronic component is connected to the underlying circuitry. After the electronic component is placed in the adhesive, the adhesive is cured to securely connect the component to the substrate. Similarly, an uncured non-conductive adhesive may be applied to a microelectronic substrate, the substrate placed on another component or device, and the adhesive cured to securely connect the substrate to the component.

Various methods of curing polymers are known. These methods typically comprise the application of heat by conventional techniques. Unfortunately, many electrical components are susceptible to damage from elevated temperatures. Consequently, great care must be taken during the curing process to avoid damaging the electrical component, the substrate, or both from the applied heat. Additionally, many different electrical components may be attached to a substrate, some of which may be more susceptible to elevated temperatures than others. Furthermore, it may be difficult and expensive to heat a selected area of an electronic substrate without exposing the surrounding area to somewhat elevated temperatures, as well. Because some components on a substrate may not be able to withstand temperatures above a certain level, the processing time required to cure is often dictated by the component having the lowest temperature threshold. Unfortunately, lower curing temperatures typically result in significantly longer curing times.

Another disadvantage associated with conventional heating techniques is the possibility of damage resulting from the effects of thermal expansion and cooling. It is known that all materials expand or contract with a change of temperature. Thus, heating a material causes it to expand, while lowering its temperature causes it to contract. When two materials having different coefficients of thermal expansion are joined together via an adhesive resin, the two materials will expand at different rates during the application of heat to cure the resin. The two materials will also contract at different rates during cooling. The result is a build-up of stresses at the interface area between the two materials and the resin. An electronic component, which may be comprised of different materials, is especially susceptible to excessive stresses during heating and cooling, which may result in the failure of the component, or the physical separation of the component materials. Damage may be particularly acute when the materials are exposed to long heating times and elevated temperatures.

Yet another disadvantage associated with conventional heating methods is the practice of using forced air in the curing process. Because many electronic components and substrates are small in size and lightweight, moving air oftentimes makes it difficult to maintain proper alignment during curing. Focused and defocused infrared (IR) heating techniques have been used to avoid the necessity of forced air. Unfortunately, each of these IR techniques heat both the component and the substrate on which the component is being mounted. As a result, a build-up of stresses may occur at the interface area between materials having different coefficients of thermal expansion.

The general use of microwave irradiation in combination with a curing agent is known. For example, U.S. Pat. No. 5,317,045 to Clark, Jr. et al. relates to a method of curing a polymeric material using microwave irradiation. The application of microwave irradiation decreases the time required to cure some polymers as compared with conventional heating methods. This is because the volumetric deposition of microwave irradiation is more efficient than conduction from the surface resulting from conventional heating techniques. See, for example, *Polymer Curing In A Variable Frequency Microwave Oven*, R. J. Lauf et al., Oak Ridge National Laboratory. See also, U.S. Pat. No. 5,296,271 to Swirbel et al., which proposes a method of curing photoreactive polymers by exposing them to microwave irradiation. Additionally, microwave processing is more economically attractive than conventional heating techniques due to the shorter processing time required to cure the resin.

The use of microwave irradiation to cure polymers, however, is not without limitations. Presently available microwave irradiation processes typically utilize a fixed frequency, such as 2.45 GHz, to cure polymers. Unfortunately, quality control and other reliability problems arise when fixed frequency microwave irradiation is used to process multiple workpieces (workpiece is generically used herein to refer to all electronic/microelectronic components and substrates subjected to microwave processing). Unless each subsequent workpiece to be irradiated is placed in substantially the same orientation and in substantially the same location within the microwave furnace as the first workpiece, the time required to cure, as well as the quality of the cure, will typically vary because of the inherent nonuniform distribution of electromagnetic energy inside microwave furnaces powered with fixed frequency microwave signals. Additionally, a particular fixed frequency may properly cure the adhesive being used to secure a component to a substrate, but the frequency may cause damage to the component being secured to the substrate, to another component on the substrate, or to another portion of the substrate as a result of localized heating or arcing.

Thus it would be desirable to provide a process for assembling electronic components which reduces the time required to cure various adhesives; allows selective curing of adhesives; allows rapid batch processing without a reduction in quality from workpiece to workpiece; reduces thermal stresses at the interface of different materials; and does not harm the electronic components or substrates.

SUMMARY OF THE INVENTION

To this end, the present invention provides systems and methods for assembling electronics which allows for rapid, selective resin curing, and avoids subjecting the components to potentially damaging cure conditions. According to one aspect of the present invention, a method for assembling electronic components (also known as "surface mount technology") comprises applying a first curable resin having adhesive properties to a substrate or to a first electronic component; mounting the first electronic component on the substrate in contacting relation with the first curable resin; and subjecting the first curable resin to a first window of microwave frequencies to cure the first curable resin. The term "window" is used hereinafter to refer to a range of microwave frequencies bounded on one end by a specific frequency and bounded on the opposite end by a different specific frequency. For example, a window would comprise all the microwave frequencies bounded by and including 2.20 GHz and 3.30 GHz. The first curable resin may be subjected to the microwave frequencies contained within the first window either simultaneously or sequentially. At least one portion of the substrate may be shielded from the first window of microwave frequencies to prevent damage to the substrate. The first curable resin may be a thermosetting resin (e.g., an epoxy) or a thermoplastic resin.

Optionally, a second curable resin having adhesive properties may be applied to the substrate, and a second electronic component may be mounted on the substrate in contacting relation with the second curable resin. The steps of applying the first and second curable resins and mounting the first and second electronic components may occur simultaneously. The second curable resin may be exposed to a second window of microwave frequencies to cure the second curable resin. The second curable resin may be subjected to the microwave frequencies of the second window, either simultaneously or sequentially. The first and second windows of microwave frequencies may be the same. At least one portion of the substrate may be shielded from the second window of microwave frequencies to prevent damage to the substrate. The second curable resin may be a thermosetting resin (e.g., an epoxy) or a thermoplastic resin.

According to another aspect of the present invention, a method for assembling electronic components comprises shielding the first electronic component from the second window of microwave frequencies, and shielding the second electronic component from the first window of microwave frequencies. Additionally, at least one portion of the substrate may be shielded from the first window of microwave frequencies, and at least one portion of the substrate may be shielded from the second window of microwave frequencies.

According to another aspect of the present invention, a method for assembling electronics comprises applying a curable resin having adhesive properties to at least one of a substrate and component; mounting the substrate on the component in contacting relation with the curable resin; and subjecting the curable resin to a first window of microwave frequencies to cure the first curable resin. Additionally, at least one portion of the substrate and at least one portion of the component may be shielded from the first window of microwave frequencies.

According to another aspect of the present invention, a system for assembling electronic components comprises application means for placing a first curable resin having adhesive properties on the substrate; mounting means for placing a first electronic component on the substrate in contacting relation with the first curable resin; and microwave generating means for subjecting the first curable resin to a first window of microwave frequencies to cure the first curable resin. The system may also comprise applicators for applying a second curable resin having adhesive properties on the substrate; mounting means for mounting a second electronic component on the substrate in contacting relation with the second curable resin; and microwave generating means for subjecting the second curable resin to a second window of microwave frequencies to cure the second curable resin.

The system may comprise shielding for protecting the first electronic component from the second window of microwave frequencies, and for protecting the second electronic component from the first window of microwave frequencies. The system may also comprise shielding for protecting at least one portion of the substrate from the first window of microwave frequencies, and at least one portion of the substrate from the second window of microwave frequencies.

By using variable frequency microwave irradiation, one can maximize resin curing efficiency while avoiding damage to the electronic component(s), to the substrate, or to both. The adhesive may be preferentially heated without heating the substrate. Furthermore, the effects of thermal stresses caused by dimensional changes of different materials is reduced due to the selective heating of the adhesive and electrical components without heating the substrate.

BRIEF DESCRIPTION OF THE DRAWINGS

FIG. 2 is an exploded perspective view of an electronic substrate having a plurality of components thereon.

FIG. 3 is a perspective view of a holder assembly suitable for use in a method according to the present invention.

FIG. 4 is a perspective view illustrating the processing of a plurality of workpieces, according to the present invention.

FIG. 5 is a section view of a workpiece, taken along lines 5—5 in FIG. 4.

DETAILED DESCRIPTION OF THE INVENTION

Figure 1:
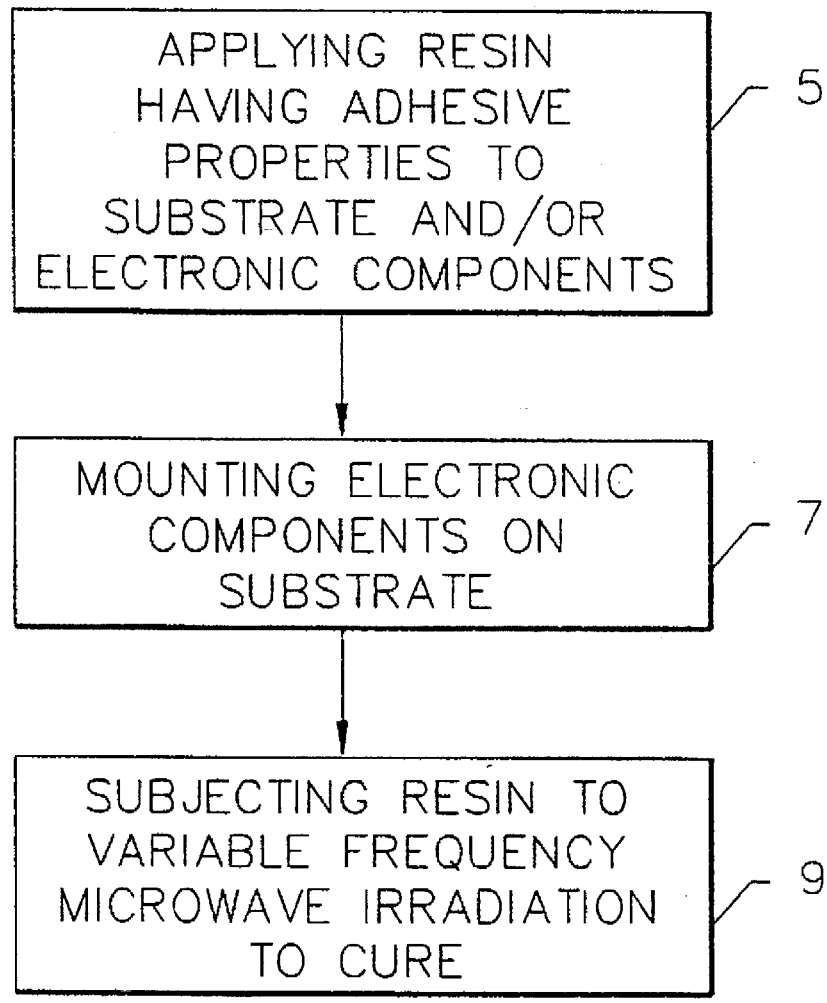
FIG. 1 is a flow diagram illustrating method steps according to the present invention.

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout.

Referring now to FIG. 1, a method for assembling electrical components, according to the present invention, is illustrated. The method comprises applying 5 a resin having adhesive properties to an electrical component, or to a substrate, or to both; mounting 7 the electrical component on the substrate within the curable resin; and subjecting 9 the curable resin to variable frequency microwave irradiation. In addition to mounting components on a substrate, components may be connected to other components, and substrates may be connected to other components, according to the present invention.

As is well known to those having skill in the art, traditional methods for mechanically and electrically securing electrical components to circuitry included the use of solder. Electrical connecting pins extending from a component were inserted into selective portions of a circuit on an electronic substrate and secured thereto by applying molten solder to the junction of each connecting pin and circuit, and allowing the solder to cool and, thereby, harden. In many applications, electrically conductive resin is replacing solder for securing components to an electronic substrate. The conductive resin is applied to various portions of a circuit where each connecting pin of a component is to be secured. The resin serves to physically secure the component to the substrate and to electrically connect the component to the circuitry. Non-conductive resins are also being used to secure various components to electronic substrates, or to each other, where electrical conductivity is not needed or is provided in some other way. Non-conductive resins are also being used to secure electronic substrates to other objects.

Referring to FIG. 2, the steps of applying 5 resin and mounting 7 a component 10 to an electronic substrate 11 are illustrated. Securing an electronic component 10 to the electronic substrate 11, according to the present invention, comprises applying a curable resin 12 to the substrate, to the electronic component, or to both via an applicator 14, setting the connecting pins 15 of the component in the resin, and curing the resin with variable frequency microwave irradiation. As would be understood by those having skill in the art, an electronic substrate 11 typically is a dielectric material having electronic circuitry 16 thereon, to which various electronic components 10 are physically and electrically connected. The circuitry 16 on the electronic substrate 11 may be screen printed using conductive materials, or may be applied by other methods known to those with skill in the art. The electronic substrate 11 may be made from flexible or rigid materials.

The process of securing electronic components 10 to a substrate 11, according to the present invention, may be performed by hand or by automated equipment. Automated applicators 14 may apply resin 12 to predetermined locations of a particular electronic substrate 11, or to the electronic components 10, or to both. Electronic components 10 may be inserted within the resin 12 by automated equipment. The substrate may then be forwarded to a variable frequency microwave furnace 31 for curing. Furthermore, the process of securing electronic components 10 to a substrate 11, according to the present invention, may be part of a larger process, including the fabrication of the electronic substrate and circuitry thereon.

Exemplary electronic components include integrated circuits and the discrete components thereof such as transistors, capacitors, resistors and the like. Suitable substrates include polymeric printed circuit board ("PCB") materials such as polyamides, polysulfones, and polyethylene terephthalate. Suitable non-polymeric substrate materials include ceramics, alumina, and silicon dioxide.

A particularly suitable class of resins are thermosetting resins. By the term, "thermosetting", it is meant that the resin irreversibly solidifies or "sets" when completely cured by activating the curing agents, such as by heating using microwave irradiation. The invention is also suitable for use with thermoplastic resins. Suitable resins include unsaturated polyesters, phenolics, acrylics, silicones, polyurethanes, polyamides and the like, and mixtures and blends thereof. Resins having adhesive properties can include various additives commonly employed with thermosetting and thermoplastic resins such as fillers, curing agents, colorants, pigments, thickening agents, and the like. Also, conductive material can be mixed or blended into the resins. Suitable conductive materials include metals in powder form, such as copper, aluminum, silver, and the like.

The step of curing 9 the resin (FIG. 1) is performed by applying variable frequency microwave irradiation selected to rapidly and uniformly cure the adhesive resin but not to adversely affect the electronic component(s) 10, or the substrate 11, or both (FIG. 2). A particularly preferred microwave furnace is described in U.S. Pat. No. 5,321,222, to Bible et al., the disclosure of which is incorporated herein by reference in its entirety. In general, a microwave furnace, within which the curing step occurs, typically includes a microwave signal generator or microwave voltage-controlled oscillator for generating a low-power microwave signal for input to the microwave furnace. A first amplifier may be provided to amplify the magnitude of the signal output from the microwave signal generator or the microwave voltage-controlled oscillator. A second amplifier is provided for processing the signal output by the first amplifier. A power supply is provided for operation of the second amplifier. A directional coupler is provided for detecting the direction of a signal and further directing the signal depending on the detected direction. Preferably a high-power broadband amplifier, such as, but not limited to, a traveling wave tube (TWT), tunable magnetron, tunable klystron, tunable twystron, and a tunable gyrotron, is used to sweep a range of frequencies of up to an octave in bandwidth spanning the 300 MHz to 300 GHz frequency range.

Appropriate use of variable frequency processing, as disclosed herein, enhances uniform processing from one workpiece to the next because placement of each workpiece within the microwave furnace is not critical. By contrast, with single frequency microwave processing, each workpiece must be oriented precisely the same way to achieve identical processing time and quality. Another advantage of using variable frequency microwave processing as disclosed herein is a reduction of the effects of thermal stresses. By selecting frequencies that cure a particular resin without causing excessive heating of the substrate or components, damage from thermal stresses may be avoided. Furthermore, because the present invention achieves shorter cure times than conventional curing methods, adjacent materials having different coefficients of thermal expansion, do not have enough time to expand or contract and, thereby, cause excessive thermal stresses at their interface.

The practical range of frequencies within the electromagnetic spectrum from which microwave frequencies may be chosen is about 0.90 GHz to 40 GHz. Every component and substrate, and every component/substrate combination, exposed to microwave irradiation typically has at least one bandwidth, or window of frequencies within this overall range that will cure resin without causing damage to the component or substrate. The term "window", as defined above, refers to a range of microwave frequencies bounded on one end by a specific frequency and bounded on the opposite end by a different specific frequency. Above or below a particular window of damage-free frequencies, damage will typically occur to the workpiece. A window may vary depending on the component configuration, geometry, and material composition. A window may also vary depending on the nature and configuration of sub-components within a component. Sub-components may have different windows of damage-free frequencies, as well. A substrate may have a component thereon requiring a narrow window of frequencies, and a component thereon requiring a wide window of frequencies. The selection of the damage-free window for a particular component, substrate or both is typically obtained either empirically through trial and error, or theoretically using power reflection curves and the like.

Within a window of damage-free frequencies for a particular workpiece, it is generally desirable to select the frequencies that result in the shortest time to cure. Preferably, a workpiece is processed with a subset of frequencies from the upper end of each window for a particular workpiece. More modes can be excited with higher frequencies than with lower frequencies, thereby resulting in shorter cure times. Additionally, better uniformity in curing is typically achieved by using the upper-end frequencies within a window. However, any subset of frequencies within a window of damage-free frequencies may be used.

Many electronic components and substrates, and combinations thereof, that are exposed to microwave irradiation have multiple windows of frequencies within which a resin will cure without causing damage to the component or substrate. For example, a workpiece may be processed without damage between 3.50 GHz and 6.0 GHz, and may also be processed without damage between 7.0 GHz and 10.0 GHz. The availability of additional windows provides additional flexibility for achieving rapid, yet damage-free curing. Often times complex geometrical configurations and material combinations are encountered in electronics applications, which may actually shrink or close a particular window of frequencies available for processing. The availability of alternative windows permits a workpiece to be processed with microwave irradiation without having to resort to other curing methods.

Preferably, the step of curing is performed by "sweeping" a workpiece with variable frequencies from within a particular window of damage-free frequencies. The term "sweeping", as used hereinafter, refers to exposing a workpiece to many of the frequencies within a particular window. Frequency sweeping results in uniformity of heating because many cavity modes can be excited. Sweeping may be accomplished by launching the different frequencies within a window either simultaneously, or sequentially. For example, assume the window of damage-free frequencies for a particular workpiece is 2.60 GHz to 7.0 GHz. Frequency sweeping would involve continuously and/or selectively launching frequencies within this range in any desirable increments, such as 2.6001 GHz, 2.6002 GHz, 2.6003 GHz ... 3.30 GHz, etc. Virtually any incremental launching pattern may be used.

The rate at which the different frequencies are launched is referred to as the sweeping rate. This rate may be any value, including, but not limited to, milliseconds, minutes, hours, or days. Preferably, the sweep rate is as rapid as practical for the particular resin and workpiece being processed. The uniformity in processing afforded by frequency sweeping, provides flexibility in how a workpiece is oriented within the microwave furnace. Maintaining each workpiece in precisely the same orientation is not required to achieve uniform processing.

Referring now to FIG. 3, a system for curing resin, according to the present invention, is illustrated. The system 30 comprises a microwave furnace 31 having a chamber 32 defined by a plurality of walls 33; a ground 34 connected to at least one of the interior chamber walls; a holder assembly 36 for removably securing an electronic substrate 11 having a plurality of components 10 thereon; and a plurality of electrical conductors 38, 38' for connecting the electronic substrate 11 to the ground 34. The present invention is especially conducive to batch processing large numbers of workpieces at the same time. As illustrated in FIG. 3, multiple holder assemblies 36 containing workpieces may be processed within a microwave furnace at the same time. Additionally, portions of the substrate 11 and the components 10 thereon may be shielded (not shown) from the microwave frequencies.

When microwave irradiation is applied to an electronic substrate, arcing may occur which may cause localized damage to the circuit board, to the component being mounted to the circuit board, or to both. Additionally, microwave irradiation may cause localized heating in selected areas of the substrate, resulting in damage to that portion of the substrate. Preferably, a holder assembly 36, as illustrated in FIG. 2, is used to reduce the possibility of damage resulting from localized heating or arcing.

Preferably, the holder assembly 36 as described in commonly assigned, copending U.S. Ser. No. 08/497,603 filed Jun. 30, 1995, the disclosure of which is incorporated herein in its entirety, comprises a substantially microwave-transparent base 40 having a surface 42 for removably receiving and securing an electronic substrate 11. The base 40 may include at least one internal bore 44 sized and configured to receive at least one electrical grounding conductor 38 therethrough. Each internal bore 44 terminates at two openings: a substrate end opening 44a in the surface 42 upon which the electronic substrate 11 is secured, and a ground end opening 44b in another portion of the base 40.

The internal bore 44 in the base 40 is preferably sized and configured to receive a conductor 38, configured at one end to electrically interconnect with an electronic component 10 and, at the opposite end, to electrically interconnect with an external ground 34. Preferably, each component 10 to be grounded, and each portion of the circuit 16 to be grounded has one or more connecting pins or conductors, as required, extending from the electronic substrate 11. When the electronic substrate 11 is placed on the holder assembly 36, the connecting pins or conductors align with the connectors 46 so that an electrical connection is made between the components 10 or circuit 16 and the external ground 34. As would be understood by those having skill in the art, other ways of electrically connecting a component 10 or portions of a circuit 16 to the ground 34 may be utilized. In the illustrated embodiment, a plurality of conductors 38 extend through a plurality of internal bores 44 in the base 40 and connect to ground 34 via a plurality of additional conductors 38'.

The holder assembly 36 may also comprise a heat sink (not shown) for protecting portions of the microelectronic substrate 11, including components 10 and circuitry 16 thereon, from localized build-up of heat. The heat sink preferably is positioned directly above, and in contact with, the portion of the microelectronic substrate 11 to be protected and is designed to absorb heat caused by microwave processing. An additional advantage of the heat sink is that it maintains an underlying substrate 11 in a substantially flat orientation during microwave processing. This is especially important when flexible microelectronic substrates are being processed, because any flexing or bending during processing may result in a component not being adequately mounted, or may exacerbate existing stresses caused by different coefficients of thermal expansion of the various connected materials. Furthermore, when a flexible microelectronic substrate is mounted to another object, any flexing or bending during processing that becomes permanent after the resin has cured may result in the microelectronic substrate malfunctioning. The heat sink may be an integral part of the holder assembly 36, or it may be a separate assembly used in conjunction with the holder assembly. Furthermore, the heat sink may be designed to protect a specific microelectronic substrate 11 or a portion thereof.

Referring now to FIGS. 4–5, the present invention may also be used to secure a microelectronic substrate 11 to other objects 50. A curable resin 12, having adhesive properties, is applied to either a substrate 11 or to the object 50 on which the substrate is to be mounted, or to both. The substrate 11 is mounted on the object 50 in contacting relation with the curable resin 12, and subjected to a window of microwave frequencies to cure the curable resin. As illustrated in FIG. 5, a plurality of objects 50 having substrates 11 mounted thereon may be processed within a microwave furnace at the same time. Securing means (not shown) may be utilized to insure that the substrate 11 is secured to the object 50 in a substantially flat orientation, and to insure that the substrate does not move out of alignment during processing. A heat sink (not shown) may also be utilized, as described above, to protect portions of the microelectronic substrate 11, including components 10 and circuitry 16 thereon, from the build-up of heat. Additionally, at least one portion of the substrate 11 and at least one portion of the object 50 may be shielded from the window of microwave frequencies.

The foregoing is illustrative of the present invention and is not to be construed as limiting thereof. The invention is defined by the following claims, with equivalents of the claims to be included therein.

That which is claimed is:

1. A method for assembling electronic components, said method comprising the steps of:
   (a) applying a first curable resin having adhesive properties to at least one of a substrate and a first electronic component;
   (b) mounting the first electronic component on the substrate in contacting relation with the first curable resin; and
   (c) subjecting the first curable resin to a first window of microwave frequencies to cure the first curable resin.

2. A method according to claim 1, further comprising the step of applying a second curable resin having adhesive properties to at least one of a substrate and a second electronic component.

3. A method according to claim 2, further comprising the step of mounting the second electronic component on the substrate in contacting relation with the second curable resin.

4. A method according to claim 2, further comprising the step of subjecting the second curable resin to a second window of microwave frequencies to cure the second curable resin.

5. A method according to claim 2, wherein the second curable resin is a thermosetting or thermoplastic resin.

6. A method according to claim 5, wherein the thermosetting resin is an epoxy.

7. A method according to claim 2, wherein the second curable resin is a conductive or non-conductive resin.

8. A method according to claim 1, wherein, during said step (c), the first curable resin is subjected to the microwave frequencies of the first window simultaneously.

9. A method according to claim 1, wherein, during said step (c), the first curable resin is subjected to the microwave frequencies of the first window sequentially.

10. A method according to claim 1, wherein at least one portion of the substrate is shielded from the first window of microwave frequencies during said step (c).

11. A method according to claim 1, wherein the first curable resin is a thermosetting or thermoplastic resin.

12. A method according to claim 11, wherein the thermosetting resin is an epoxy.

13. A method according to claim 1, wherein the first curable resin is a conductive or non-conductive resin.

14. A method for assembling electronic components, said method comprising the steps of:
   (a) applying a first curable resin having adhesive properties to at least one of a substrate and a first electronic component;
   (b) mounting the first electronic component on the substrate in contacting relation with the first curable resin;
   (c) applying a second curable resin having adhesive properties to at least one of a substrate and a second electronic component;
   (d) mounting the second electronic component on the substrate in contacting relation with the second curable resin;
   (e) subjecting the first curable resin to a first window of microwave frequencies to cure the first curable resin; and
   (f) subjecting the second curable resin to a second window of microwave frequencies to cure the second curable resin.

15. A method according to claim 14, wherein said steps (a), (b), (c), and (d) are performed simultaneously.

16. A method according to claim 14, wherein, during said step (e), the first curable resin is subjected to the microwave frequencies of the first window simultaneously.

17. A method according to claim 14, wherein, during said step (e), the first curable resin is subjected to the microwave frequencies of the first window sequentially.

18. A method according to claim 14, wherein, during said step (f), the second curable resin is subjected to the microwave frequencies of the second window simultaneously.

19. A method according to claim 14, wherein, during said step (f), the second curable resin is subjected to the microwave frequencies of the second window sequentially.

20. A method according to claim 14, wherein the first electronic component is shielded from the second window of microwave frequencies during said step (f).

21. A method according to claim 14, wherein the second electronic component is shielded from the first window of microwave frequencies during said step (e).

22. A method according to claim 14, wherein at least one portion of the substrate is shielded from the first window of microwave frequencies during said step (e).

23. A method according to claim 14, wherein at least one portion of the substrate is shielded from the second window of microwave frequencies during said step (f).

24. A method for assembling electronic components, said method comprising the steps of:
   (a) applying a curable resin having adhesive properties to at least one of a substrate and a component;
   (b) mounting the substrate on the component in contacting relation with the curable resin; and
   (c) subjecting the curable resin to a first window of microwave frequencies to cure the first curable resin.

25. A method according to claim 24, wherein, during said step (c), the curable resin is subjected to the microwave frequencies of the first window simultaneously.

26. A method according to claim 24, wherein, during said step (c), the curable resin is subjected to the microwave frequencies of the first window sequentially.

27. A method according to claim 24, wherein at least one portion of the substrate is shielded from the first window of microwave frequencies during said step (c).

28. A method according to claim 24, wherein at least one portion of the component is shielded from the first window of microwave frequencies during said step (c).

* * * * *